US012707666B2

(12) United States Patent
Tringali et al.

(10) Patent No.: US 12,707,666 B2
(45) Date of Patent: Aug. 11, 2026

(54) HEMT DEVICE HAVING IMPROVED ON-STATE PERFORMANCE AND MANUFACTURING PROCESS THEREOF

(71) Applicant: STMicroelectronics International N.V., Geneva (CH)

(72) Inventors: Cristina Tringali, Augusta (IT); Aurore Constant, Tours (FR); Maria Eloisa Castagna, Catania (IT); Ferdinando Iucolano, Gravina di Catania (IT)

(73) Assignee: STMicroelectronics International N.V., Geneva (CH)

( * ) Notice: Subject to any disclaimer, the term of this patent is extended or adjusted under 35 U.S.C. 154(b) by 364 days.

(21) Appl. No.: 18/591,541

(22) Filed: Feb. 29, 2024

(65) Prior Publication Data

US 2024/0304710 A1 Sep. 12, 2024

(30) Foreign Application Priority Data

Mar. 10, 2023 (IT) ........................ 102023000004551

(51) Int. Cl.
*H01L 29/778* (2006.01)
*H01L 29/06* (2006.01)
(Continued)

(52) U.S. Cl.
CPC ........... *H10D 30/47* (2025.01); *H10D 30/015* (2025.01); *H10D 62/10* (2025.01); *H10D 64/111* (2025.01)

(58) Field of Classification Search
CPC ...... H10D 30/47; H10D 30/015; H10D 30/01; H10D 30/475; H10D 62/10; H10D 64/111;
(Continued)

(56) References Cited

U.S. PATENT DOCUMENTS 10,573,734 B1 2/2020 Chou et al.
11,201,234 B1 12/2021 Huang et al.
(Continued)

FOREIGN PATENT DOCUMENTS

CN 108461543 A 8/2018
EP 4199105 A1 6/2023
(Continued)

OTHER PUBLICATIONS

Islam et al., "Schottky barrier height reduction for holes by Fermi level depinning using metal/nickel oxide/silicon contacts," *Applied Physics Letters* 105, 182103, 2014, 4 pages.

(Continued)

*Primary Examiner* — Nikolay K Yushin
(74) *Attorney, Agent, or Firm* — Seed Intellectual Property Law Group LLP

(57) ABSTRACT

A HEMT transistor has a body having a top surface and a heterostructure, and a gate region having a semiconductor material and arranged on the top surface of the body. The gate region has a first lateral sidewall and a second lateral sidewall opposite to the first lateral sidewall. The HEMT device further has a sealing layer of non-conductive material that extends on and in contact with the first and the second lateral sidewalls of the gate region; and a passivation layer of non-conductive material that has a surface portion. The surface portion extends on the top surface of the body, laterally to the first lateral sidewall of the gate region. The sealing layer and the passivation layer have different geometrical parameters and/or are of different material.

20 Claims, 6 Drawing Sheets

(51) Int. Cl.

| | |
|---|---|
| ***H01L 29/40*** | (2006.01) |
| ***H01L 29/66*** | (2006.01) |
| ***H10D 30/01*** | (2025.01) |
| ***H10D 30/47*** | (2025.01) |
| ***H10D 62/10*** | (2025.01) |
| ***H10D 64/00*** | (2025.01) |

(58) Field of Classification Search

CPC ...... H10D 64/00; H10D 62/343; H10D 62/17; H10D 62/8503; H10D 62/85; H10D 64/112; H10D 64/0124; H10D 64/691; H10D 64/01354; H10W 74/137; H10W 74/10; H10W 74/147; H10W 74/43

See application file for complete search history.

(56) References Cited

U.S. PATENT DOCUMENTS

| | | | |
|---|---|---|---|
| 11,799,000 | B1 | 10/2023 | Lai et al. |
| 2012/0193637 | A1 | 8/2012 | Kalnitsky et al. |
| 2013/0069115 | A1 | 3/2013 | Nakazawa et al. |
| 2013/0082276 | A1 | 4/2013 | Park et al. |
| 2013/0193485 | A1 | 8/2013 | Akiyama et al. |
| 2013/0270572 | A1 | 10/2013 | Brown et al. |
| 2014/0070280 | A1 | 3/2014 | Briere |
| 2014/0239346 | A1 | 8/2014 | Green et al. |
| 2014/0264369 | A1 | 9/2014 | Padmanabhan et al. |
| 2014/0264431 | A1 | 9/2014 | Lal |
| 2016/0141404 | A1 | 5/2016 | Tsai et al. |
| 2017/0170284 | A1 | 6/2017 | Li et al. |
| 2017/0294530 | A1 | 10/2017 | Moens et al. |
| 2017/0352754 | A1 | 12/2017 | Beach et al. |
| 2018/0358456 | A1 | 12/2018 | Iucolano et al. |
| 2020/0212173 | A1 | 7/2020 | Liu et al. |
| 2020/0335617 | A1 | 10/2020 | Banerjee et al. |
| 2020/0365718 | A1 | 11/2020 | Lee et al. |
| 2021/0184010 | A1 | 6/2021 | Chong et al. |
| 2021/0328028 | A1 | 10/2021 | Chen |
| 2022/0052163 | A1 | 2/2022 | Coppens et al. |
| 2022/0052191 | A1 | 2/2022 | Cheng |
| 2022/0302291 | A1 | 9/2022 | Guo et al. |
| 2022/0310824 | A1 | 9/2022 | Yang |
| 2022/0393024 | A1 | 12/2022 | Hao et al. |
| 2022/0399328 | A1 | 12/2022 | Kaufmann et al. |
| 2024/0266425 | A1 | 8/2024 | Constant et al. |
| 2024/0274702 | A1 | 8/2024 | Constant et al. |
| 2024/0304711 | A1 | 9/2024 | Tringali et al. |
| 2024/0304713 | A1 | 9/2024 | Iucolano et al. |
| 2024/0313102 | A1 | 9/2024 | Miccoli et al. |
| 2024/0332413 | A1 | 10/2024 | Iucolano et al. |
| 2024/0405115 | A1 | 12/2024 | Castagna et al. |

FOREIGN PATENT DOCUMENTS

| | | | |
|---|---|---|---|
| WO | WO 2017210235 | A1 | 12/2017 |
| WO | WO 2018231928 | A1 | 12/2018 |
| WO | WO 2022194367 | A1 | 9/2022 |
| WO | WO 2023276972 | A1 | 1/2023 |

OTHER PUBLICATIONS

Cai, "Realization of normally-off GaN HEMTs for high voltage and low resistance applications," Thesis, University of Liverpool, 2015, 201 pages.

Hsu et al., "Development of GaN HEMTs Fabricated on Silicon, Silicon-on-Insulator, and Engineered Sibstrates and Heterogeneous Integration," Micromachines 2021, vol. 12, 1159, 32 pages.

Zhang et al., "On-chip A1GaN/GaN HEMTs with the Compatible Normally-off p-GaN Gate and Normally-on MIS Gate Fabrication Processes," 2022 IEEE International Conference on Solid-State & Integrated Circuit Technology (ICSICT), Oct. 25, 2022, 3 pages.

U.S. Appl. No. 18/592,816, filed Mar. 1, 2024.

U.S. Appl. No. 18/591,344, filed Feb. 29, 2024.

U.S. Appl. No. 18/596,536, filed Mar. 5, 2024.

U.S. Appl. No. 18/612,646, filed Mar. 21, 2024.

U.S. Appl. No. 18/422,867, filed Jan. 25, 2024.

U.S. Appl. No. 18/424,471, filed Jan. 26, 2024.

U.S. Appl. No. 18/671,584, filed May 22, 2024.

100
101
102
110B
78
100A
56
54
59
110A
110
58
57
53
Z
Y
X 100
101
102
79
110B
78
100A
56
54
59
110A
110
58
57
53
Z
Y
X 100
67
70
80
75B
87'
78
100A
56
54
59
75A
75
58
57
53
Z
Y
X

HEMT DEVICE HAVING IMPROVED ON-STATE PERFORMANCE AND MANUFACTURING PROCESS THEREOF

BACKGROUND

Technical Field

The present disclosure relates to a High Electron Mobility Transistor (HEMT) having improved on-state performance and to the manufacturing process thereof.

Description of the Related Art

As known, HEMT devices, also known as heterostructure field effect transistors (HFET), are finding wide diffusion thanks to the possibility of operating at high voltages and thanks to their high breakdown voltage and high charge carrier mobility.

In an HEMT device, a semiconductive heterostructure (based generally on AlGaN/GaN layers) allows a so-called 2-dimensional electron gas (2DEG) to be spontaneously generated in the device, thereby forming a channel path for electrical charges. The spontaneous channel may be modulated by applying suitable voltages at a gate region, over the channel path.

AlGaN/GaN HEMTs are normally depletion-mode. However, for practical applications, enhancement mode (normally off) devices are preferred to obtain safe operation and to drive circuits simplification.

Several approaches to achieve normally-off HEMTs based on AlGaN/GaN layers have been proposed, including forming recessed gate transistors, carrying out particular manufacturing steps such as incorporating fluorine plasma under the gate, or forming the gate region of p-GaN. The latter solution is for example used in products available on the market and considered hereinbelow.

For example, FIG. 1 shows an HEMT device 1, formed on a semiconductor body 2, here comprising a substrate layer 3, a first layer 4 and a second layer 6 (hereinafter also referred to as channel layer 4 and barrier layer 6).

Substrate layer 3 may comprise a silicon substrate and gallium nitride (GaN) buffer layer, not shown separately in FIG. 1.

Channel layer 4 is of a first semiconductor material, such as for example a first semiconductive alloy of elements of the groups III and V of the periodic table; for example, the channel layer 4 may be of gallium nitride (GaN).

Barrier layer 6 overlies, and is in direct contact with, the channel layer 4, and is of a second semiconductor material, such as, for example, a second semiconductive alloy, different from the first semiconductive alloy, of elements of the groups III-V of the periodic table. For example, barrier layer 6 may be of aluminium gallium nitride (AlGaN).

Channel layer 4 and barrier layer 6 are for example of N-type.

A gate region 7 extends on barrier layer 6. Gate region 7 is formed, for example, by a third semiconductor material, such as for example a third semiconductive alloy of elements of the groups III and V of the periodic table; in particular, gate region 7 is formed here by gallium nitride of P conductivity type (pGaN).

A first insulating region 9, for example of silicon oxide, extends on barrier layer 6, on lateral surfaces and on an upper surface of the gate region 7.

An opening 11 extends throughout first insulating region 9, on top of gate region 7, and a gate metal region 10, for example of TiN/AlCu/TiN, extends in the opening 11, in direct electrical contact with gate region 7, and partially on the first insulating region 9.

A second insulating region 12, for example of silicon oxide, extends on the first insulating region 9 and on the gate metal region 10.

A field plate 13, of conductive material, may extend on the first insulating region 9, laterally to the gate metal region 10, and below the second insulating region 12. Field plate 13 is possibly formed from a same metal layer as the gate metal region 10.

A source metal region 15, for example of Ti/AlCu/TiN, extends on and laterally to the second insulating region 12 and is in direct electrical contact with the barrier layer 6. In HEMT device 1, source metal region 15 has a portion extending over gate metal region 10 and over field plate region 13 and has a shielding function.

A drain metal region 16, for example of Ti/AlCu/TiN, extends on and laterally to the second insulating region 12 (on an opposite side of the gate region 7 with respect to source metal region 15), on and in direct electrical contact with barrier layer 6.

In this type of HEMT transistors, etching of the layers over semiconductor body 2 is critic and may affect the barrier layer 6. In fact, such etchings may damage barrier layer 6 and cause an increase of the sheet resistance thereof, thereby causing an increase of the on-resistance (Ron) of the HEMT device 1.

BRIEF SUMMARY

To avoid this criticality, it has already been suggested to change parameters (thickness, percentage of Al) of barrier layer 6; however, this solution has the disadvantage of reducing the pinch-off voltage Vpo and thus the threshold voltage of the device; in addition, it also reduces the gate current Igon. The selection of the parameters of the barrier layer 6 thus implies a trade-off between Ron, Vpo/Vth and Igon.

Thus, an aim of the disclosure is to overcome the drawbacks and limitations of the prior art.

According to the present disclosure, there are provided a HEMT device and the manufacturing process thereof.

BRIEF DESCRIPTION OF THE SEVERAL VIEWS OF THE DRAWINGS

For the understanding of the present disclosure, embodiments thereof are now described, purely as non-limitative examples, with reference to the enclosed drawings, wherein.

DETAILED DESCRIPTION

Figure 1:
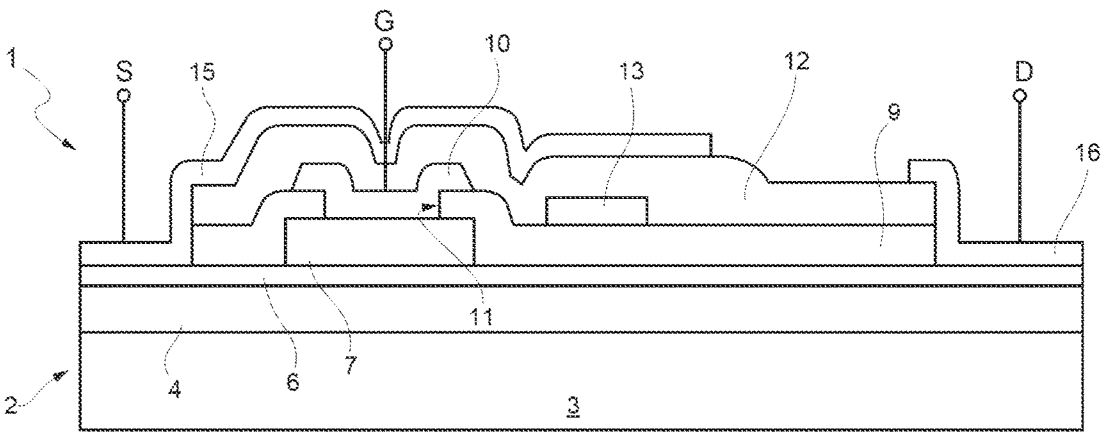
FIG. 1 is a cross-section of a known HEMT device.

The following description refers to the arrangement shown in the drawings; consequently, expressions such as "above", "below", "upper", "lower", "top", "bottom", "right", "left" and the like are relative to the attached figures and should not be interpreted in a limiting way.

Figure 2:
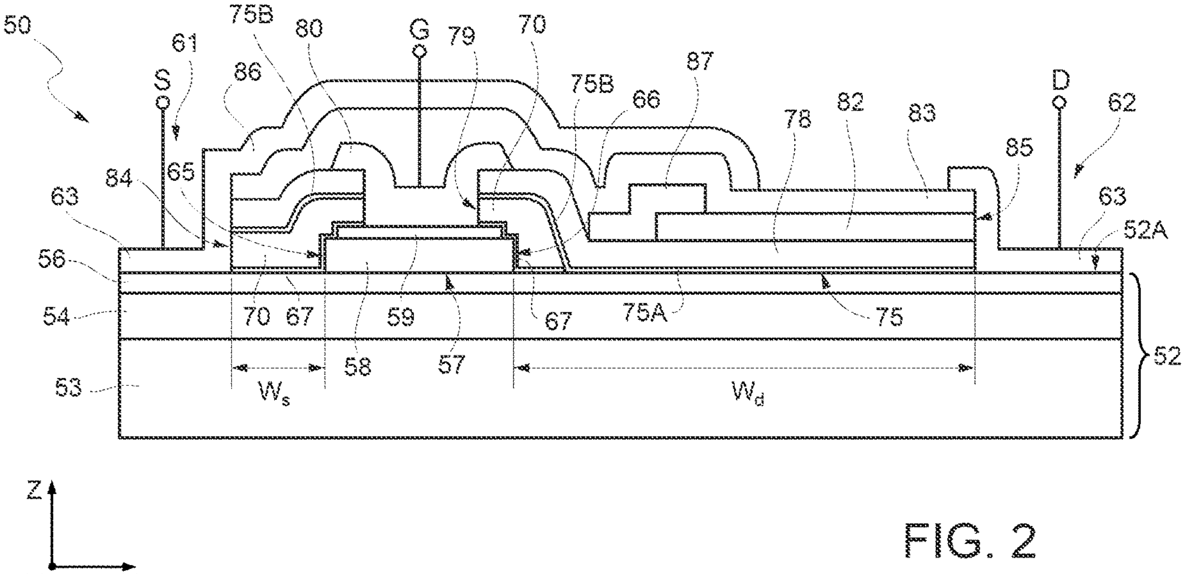
FIG. 2 is a cross-section of a HEMT device according to an embodiment.

FIG. 2 shows a HEMT device 50, comprising a body 52 having a top surface 52A and formed by a substrate 53 and a heterostructure, which includes here a channel layer 54 and a barrier layer 56.

Substrate 53 may include a silicon layer and gallium nitride (GaN) buffer layer, not shown separately in FIG. 2.

Channel layer 54 is of a first semiconductor material, such as a first semiconductive alloy of elements of the groups III and V of the periodic table; for example, channel layer 54 may be of gallium nitride (GaN) or an alloy comprising GaN such as InGaN, in particular here of GaN.

Barrier layer 56 overlies, and is in direct contact with, channel layer 54, and is of a second semiconductor material, such as a second semiconductive alloy, different from the first semiconductive alloy, of elements of the groups III-V of the periodic table. For example, barrier layer 56 may be a ternary or quaternary alloy of gallium nitride, such as $Al_xGa_{1-x}N$, AlInGaN, $In_xGa_{1-x}N$, $Al_xIn_{1-x}Al$, AlScN, in particular here of AlGaN.

Channel layer 54 and barrier layer 56 are for example of N-type.

A gate region 57 extends on and in contact with the barrier layer 56. In a manner not shown, gate region 57 is strip-shaped and extends along a first horizontal axis Y of a cartesian reference system XYZ.

In FIG. 2, gate region 57 includes a channel modulating region 58, here of pGaN (gallium nitride of P conductivity type), and an interlayer region 59.

Channel modulating region 58 operates to modulate the channel formed at the interface between the channel layer 56 and the barrier layer 56, below the channel modulating region 58, based on the voltage applied thereto.

In detail, in this embodiment, HEMT device 50 is a normally-off HEMT.

Interlayer region 59 operates to facilitate switching-on of channel modulating region 58 and to create a barrier to the diffusion of contaminants from upper layers, as described later on. Interlayer region 59 may be of a material such as TiN.

In the embodiment of FIG. 2, interlayer region 59 has a smaller width than channel modulating region 58, along a second horizontal axis X of cartesian reference system XYZ.

Interlayer region 59 is optional.

HEMT device 50 includes a source region 61 and a drain region 62 of conductive material, for example of Ti/AlCu/TiN, which form a source terminal S and, respectively, a drain terminal D of the HEMT device 50.

Source region 61 and drain region 62 includes each a respective contact portion 63 that extends on the top surface 52A of the body 52, here in direct contact with the barrier layer 56.

The contact portions 63 of the source region 61 and drain region 62 form an ohmic contact with the heterostructure, in particular with the 2DEG arranged at the interface between the channel layer 54 and barrier layer 56.

In practice, the contact portions 63 of the source and drain regions 61, 62 form portions of a source and, respectively, a drain current conducting terminal of the HEMT device.

Gate region 57 is arranged, along axis X, between the contact portions 63 of the source region 61 and drain region 62.

In other words, gate region 57 faces, on a source-side (left in FIG. 2), the contact portion 63 of the source region 62 and faces, on a drain-side (right in FIG. 2), the contact portion 63 of the drain region 62.

In detail, gate region 57 has a source lateral sidewall 65 facing towards the contact portion 63 of the source region 61 and a drain lateral sidewall 66, opposite to the source lateral sidewall 65 and facing towards the contact portion 63 of the drain region 62.

In this embodiment, source and drain lateral sidewalls 65, 66 of the gate region 57 include the lateral sidewalls of both the channel modulating region 58 and the interlayer region 59.

On the source-side, the gate region 57 is arranged at a distance $W_s$, parallel to axis X, from the contact portion 63 of the source region 61 and, on the drain-side, at a distance $W_d$, parallel to axis X, from the contact portion 63 of the drain region 62. Distances $W_s$ and $W_d$ may be comprised, for example, between 0.5 μm and 20 μm, depending on the specific application of the HEMT device 50, in particular depending on the specific voltage class of the HEMT device 50 (e.g., the maximum voltage that the HEMT device 50 needs to sustain, in use).

In detail, in this embodiment, the distance $W_s$ is smaller than the distance $W_d$; for example, distance $W_s$ may be from 0.5 μm to 1 μm and distance $W_d$ may be from 1.8 μm to 20 μm, in particular the ratio $W_s/W_d$ may be of about ¼.

In other words, gate region 57 is arranged, along axis X, closer to the contact portion 63 of the source region 61 than to the contact portion 63 of the drain region 62.

A sealing layer 67 of insulating material, for example an oxide such as $Al_2O_3$, $HfO_2$ or AlON, in particular here of $Al_2O_3$, covers the source and drain lateral sidewalls 65, 66 of channel modulating region 58 and interlayer region 59 and, partially, an upper side of channel modulating region 58 and an upper side of interlayer region 59.

The sealing layer 67 has a thickness comprised between 2 and 10 nm, for example of 2.5 nm.

In this embodiment, sealing layer 67 has surface portions that extend from the source and drain lateral sidewalls 65, 66 of gate region 57, along axis X, continuously on the top surface 52A of the body 52.

In detail, the sealing layer 67 extends, on the source-side of the gate region 57, up to the contact portion 63 of the source region 61, i.e., for the whole distance $W_s$.

On the drain-side of the gate region 57, the sealing layer 67 has a surface portion that extends on the top surface 52A only for a portion of the distance $W_d$, in particular for a portion much smaller than the distance $W_d$, for example comprised between 0.1 μm and 0.3 μm.

Sealing layer 67 also extend along axis Y, in a manner not shown here.

Spacer regions 70 of insulating material, for example of oxide or nitride, in particular of silicon oxide, extend on the sealing layer 67.

In detail, spacer regions 70 overlie sealing layer 67, in direct contact therewith.

A passivation layer 75 of insulating material, for example an oxide or a nitride, in particular here of AlN, extends on the spacer regions 70 and, on the drain-side of the gate region 57, also on a portion of the top surface 52A of the body 52.

In detail, passivation layer 75 may be of a material having a small lattice mismatch with barrier layer 56; for example, passivation layer 75 may be of AlN if barrier layer 56 comprises, or is completely formed by, AlGaN.

Passivation layer 75 may have a thickness comprised, for example, between 2 nm and 10 nm, for example of 5 nm.

In this embodiment, passivation layer 75 has a greater thickness than the sealing layer 67.

In detail, passivation layer 75 has a surface portion 75A, which extends on a portion of the top surface 52A of the body 52 on the drain-side of the gate region 57, and a raised portion 75B, which extends on the spacer regions 70.

The surface portion 75A extends in direct contact with the barrier layer 56.

The surface portion 75A extends, along axis X, at a distance from the drain lateral sidewall 66 of the gate region 57.

In detail, surface portion 75A extends contiguous to the surface portion of sealing layer 67, between the sealing layer 67 and the contact portion 63 of the drain region 62.

In greater detail, in this embodiment, the surface portion 75A extends for the whole width between the surface portion of the sealing layer 67 and the contact portion 63 of the drain region 62.

Surface portion 75A of the passivation layer 75 may be epitaxial with respect to the barrier layer 56; therefore, the surface portion 75A may have a monocrystalline structure.

The monocrystalline structure may be detected by known techniques such as Energy-dispersive X-ray (EDX) spectroscopy or Electron Energy Loss (EELS) spectroscopy.

Raised portion 75B of the passivation layer 75 extends on the spacer regions 70, in particular overlies thereon and in contact therewith.

Raised portion 75B may have a polycrystalline structure or an amorphous structure.

A first insulating layer 78, for example of oxide or nitride, in particular of silicon oxide, extends on passivation layer 75.

In detail, the first insulating layer 78 overlies the passivation layer 75, in direct contact therewith.

First insulating layer 78, passivation layer 75, spacer regions 70 and sealing layer 67 are opened on the interlayer region 59, thereby forming a gate opening 79.

A gate metal 80, for example a multilayer of TiN/AlCu/TiN, extends in the gate opening 79, in direct electrical contact with the interlayer region 59, and, in this embodiment, partially on the first insulating layer 78.

A second insulating layer 82, for example an oxide or a nitride, in particular here of silicon nitride, extends, on the drain-side of the gate region 57, on the first insulating layer 78.

The fact that the second insulating layer 82 is of a different material with respect to the first insulating layer 78 allows to simplify the manufacturing process, as discussed further below.

The second insulating layer 82 has a thickness comprised, for example, between 50 nm and 100 nm.

In detail, the second insulating region 82 faces partially the surface portion 75A of the passivation layer 75.

A third insulating layer 83, for example an oxide or a nitride, in particular of silicon oxide, extends on first insulating layer 78, on gate metal 68 and on the second insulating layer 82.

A source opening 84 and a drain opening 85 extend on the source-side and, respectively, on the drain-side of the gate region 57 vertically, parallel to axis Z, up to the top surface 52A of the body 52.

The contact portions 63 of the source region 61 and of the drain region 62 extend in the source opening 84 and, respectively, the drain opening 85.

In this embodiment, the source region 61 further has a shielding portion 86 extending over the gate metal 68 with a shielding function.

In this embodiment, a field plate 87 extends, on the drain-side of the gate region 57, at a distance from the gate region 57, partially on the first insulating layer 78 and partially on the second insulating layer 82, below the second insulating layer 69. Field plate 87 may be formed by the same metal layer used to form the gate metal 80.

In other words, field plate 87 has a non-planar structure and extends, along axis X, at different distances measured along axis Z from barrier layer 56. In detail, a portion of the field plate 87 closer to the contact portion 63 of the drain region 62 is arranged at a greater distance (measured along axis Z) from barrier layer 56.

The non-planar structure of the field plate 87 allows to have, effectively, a double field plate, thereby allowing a higher design freedom to modulate the electric field in the body 52.

Shielding portion 86 of the source region 61 extends here also over the field plate 87.

In the HEMT device 50 of FIG. 2, the fact that, on the drain-side of the gate region 57, the sealing layer 67 has different properties (different material and/or different thickness) with respect to the surface portion 75A of the passivation layer 75, allows to form different 2DEGs below the gate region 57 and below the surface portion 75A.

Namely, a first 2DEG (hereinafter also called gate 2DEG) forms at the interface between the channel layer 54 and the barrier layer 56 below gate region 57 and a second 2DEG (hereinafter also called access 2DEG) forms at the interface between the channel layer 54 and the barrier layer 56 below the surface portion 75A of passivation layer 75.

By tailoring and optimizing the parameters/features of the sealing layer 67 and the passivation layer 75, it is thus possible to tailor and optimize the densities of gate 2DEG and of access 2DEG according to the desired properties.

In particular, with the structure of FIG. 2, it is possible to have a high sheet resistance Rsh below and around gate region 57, resulting in a high threshold voltage and low electric field at the corner between channel modulating region 58 and barrier layer 56 (at gate 2DEG) and a low sheet resistance Rsh below passivation layer 75, resulting in a low on-resistance Ron (at access 2DEG).

HEMT device 50 thus allows to obtain a good trade-off between gate current, threshold voltage and on-resistance.

Moreover, the fact that the surface portion 75A of the passivation layer 75 may have the epitaxial properties of the barrier layer 56 would allow to reconstruct possible defects of the barrier layer 56 at the top surface 52A of the body 52 originated during manufacturing. Accordingly, the HEMT device 50 may achieve good electrical performances.

In addition, when passivation layer 75 comprises AlN and barrier layer 56 comprises AlGaN, passivation layer 75 may allow to reduce the interface state density, increase the 2DEG carrier density and the drift mobility through suppression of the trapping effect.

HEMT device 50 may be manufactured as shown in FIGS. 3A-3G, showing a wafer before dicing. FIGS. 3A-3G show the manufacturing steps of the HEMT 50 with respect to a portion of the HEMT device 50 including the gate region 57 and the respective source-side and drain-side, i.e., manufacturing steps for forming the source and drain regions are not shown.

Figure 3A:
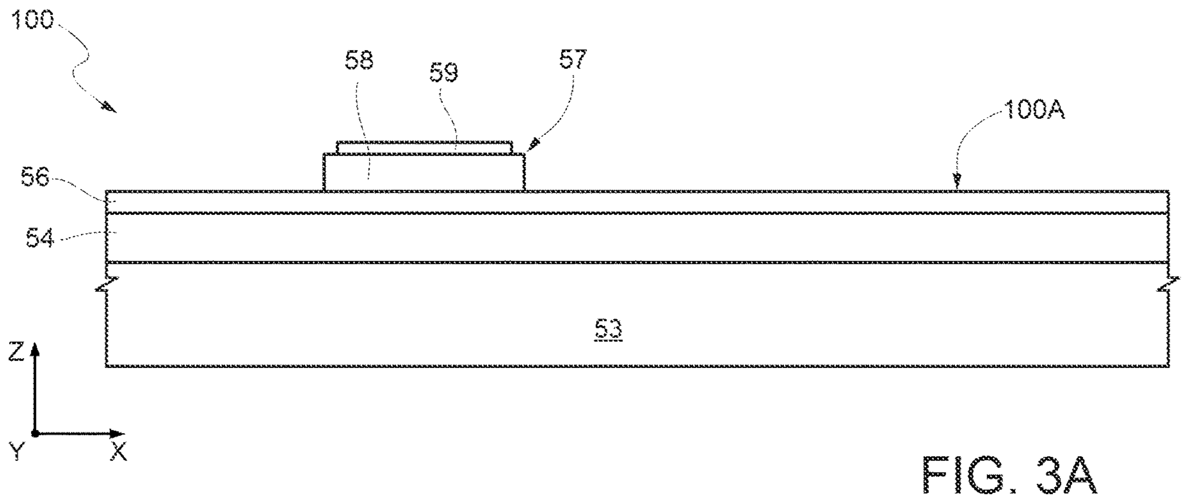
FIG. 3A-3G are cross-sections of a semiconductor wafer in subsequent manufacturing steps of the HEMT device of FIG. 2.

FIG. 3A shows a wafer 100 having a top surface 100A and comprising a stack of layers including substrate 53, channel layer 54 and barrier layer 56. Gate region 57 has been already formed on barrier layer 56.

For example, channel modulating region 58 and interlayer region 59 may be formed by sputtering a TiN layer on a pGaN layer grown epitaxially on barrier layer 56 and by lithographically defining the TiN layer and the pGaN layer using a single mask (not shown) with a lateral etch to obtain the smaller width of interlayer region 59; however, any other manufacturing steps are possible, for example by using two different masks.

Figure 3B:
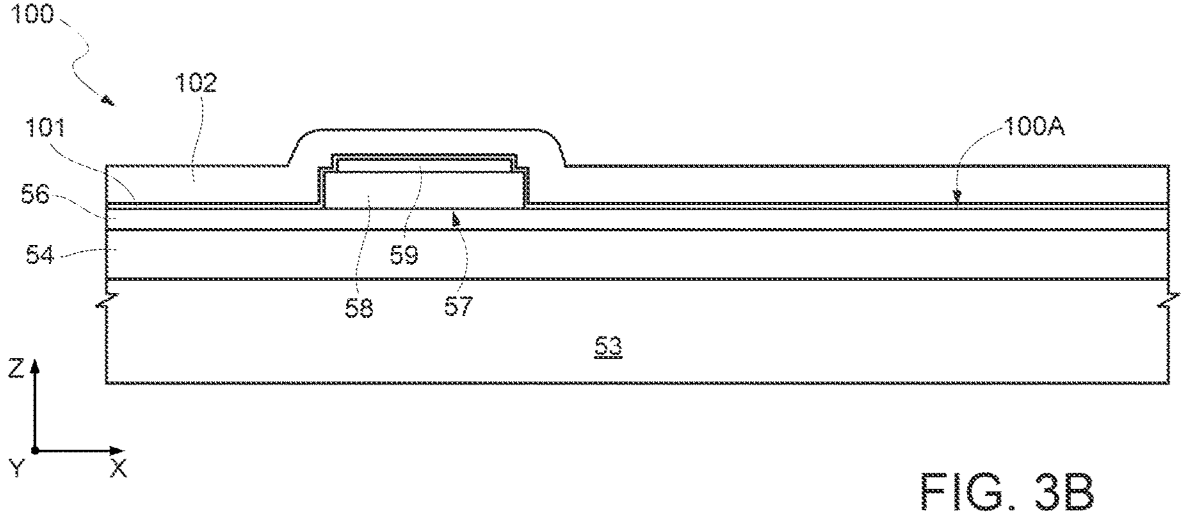

In FIG. 3B, a work sealing layer 101, destined to form the sealing layer 67, is formed on gate region 57 and on barrier layer 56, where exposed, and a spacer layer 102, destined to form the spacer regions 70, is formed on the work sealing layer 101.

For example, work sealing layer 101 is thermally or plasma deposited with an ALD (Atomic Layer Deposition) technique in a $H_2O$ based environment at 300° C. for a thickness of, e.g., 2.5 nm.

Spacer layer 102 may be, e.g., deposited by PECVD (Plasma Enhanced Chemical Vapour Deposition) in a $SiO_2$ $SiH_4$-based environment for a thickness of, e.g., 200 nm.

Figure 3C:
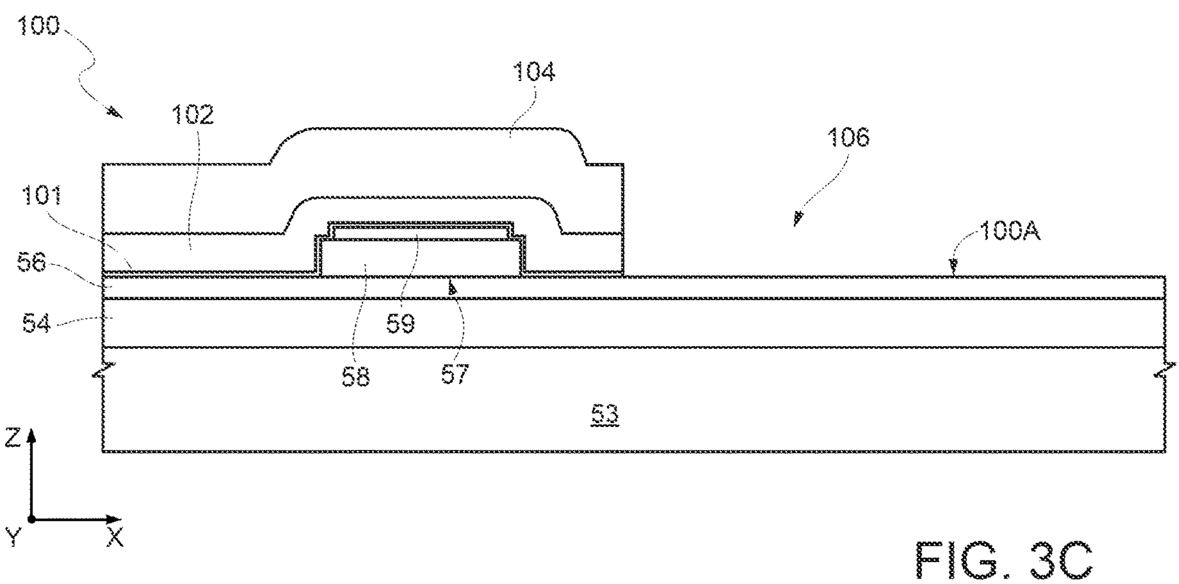

In FIG. 3C, a mask 104, for example of polymeric material, is formed on the spacer layer 102.

The mask 104 exposes a portion of the spacer layer 102, on the drain-side of the gate region 57, extending above the portion of top surface 100A on which surface portion 75A of passivation layer 75 is intended to be formed.

In FIG. 3C, an opening 106 is also formed through the spacer layer 102 and the work sealing layer 101, by using mask 104.

The exposed portion of the spacer layer 102 is etched anisotropically (e.g., through dry etch), thereby exposing the underlying work sealing layer 101. The so-exposed work sealing layer 101 is etched, for example through a wet etch, using an etchant selective with respect to the material of barrier layer 56.

If the barrier layer 56 is of AlGaN, the etchant may be for example EKC265™ produced by DuPont™.

The selective etchant may allow to reduce as much as possible the probability of damaging the underlying barrier layer 56. Accordingly, the access 2DEG may not be affected by this etching and, therefore, the sheet resistance Rsh is also not negatively affected.

Figure 3D:
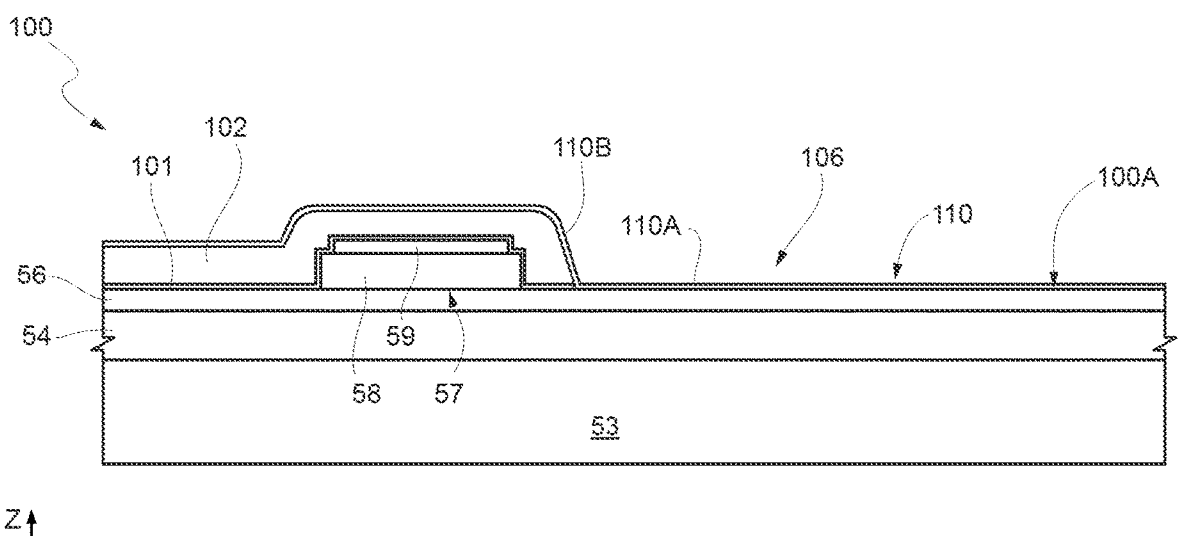

Then, FIG. 3D, the mask 104 is removed and a work passivation layer 110 (destined to form passivation layer 75) is formed, e.g., of AlN, and using an ALD technique at about 370° C. for a thickness of, for example, 5 nm.

The work passivation layer 110 has a surface portion 110A, which extends on the exposed portion of the top surface 100A and will form the surface portion 75A of the passivation layer 75, and a raised portion 110B, which extends on the remaining portion of the spacer layer 102 and will form the raised portion 75B of the passivation layer 75.

Surface portion 110A may grow layer by layer on barrier layer 56. This allows to reconstruct the crystalline structure of the barrier layer 56, at the top surface 100A, which may have been damaged in initial manufacturing steps, e.g., during the etching step that forms the channel modulation region 58, and/or during removal of work sealing layer 101 described with reference to FIG. 3C.

The surface portion 110A may follow the epitaxial properties of barrier layer 56 and have a monocrystalline structure.

Figure 3E:
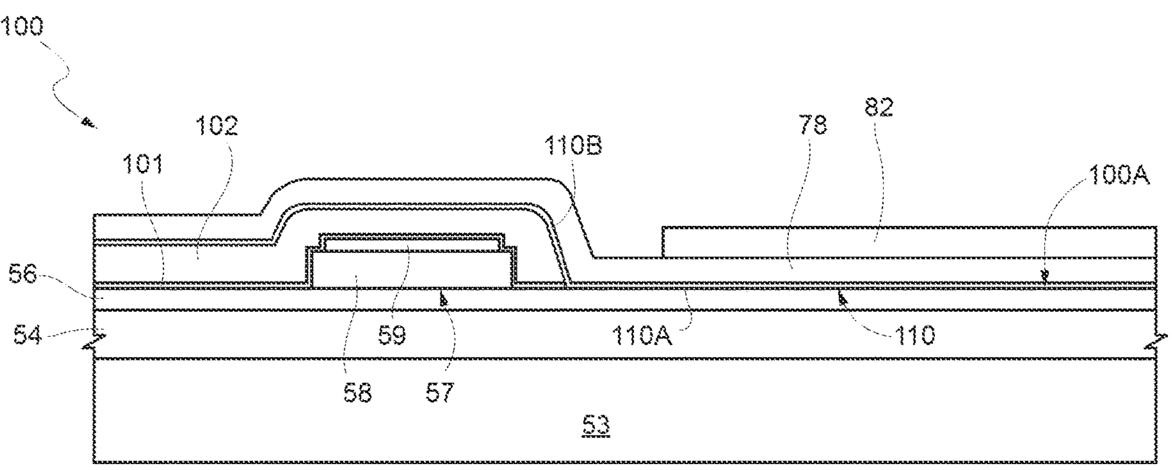

In FIG. 3E, first and second insulating layers 78, 82 are formed on the work passivation layer 110.

The first insulating layer 78, for example of silicon oxide, is deposited, for example by PECVD in a $SiO_2$ $SiH_4$-based environment for a thickness of, e.g., 50 nm.

The second insulating layer 82, for example of silicon nitride, may be deposited by PECVD for a thickness of, e.g., 80 nm. The second insulating layer 82 may be formed by blanket deposition and subsequent patterning.

The fact that first insulating layer 78 may be of a different material than the second insulating layer 82 allows to simplify the integration of the second insulating layer 82 in the process flow. In fact, first and second insulating layer 78, 82 would have different etching rates one with respect to the other. Accordingly, while patterning the second insulating layer 82, it is possible to better control the residual thickness of the first insulating layer 78 below. As a consequence, the distance of the field plate 87 from the surface 100A may be controlled accurately.

Figure 3F:
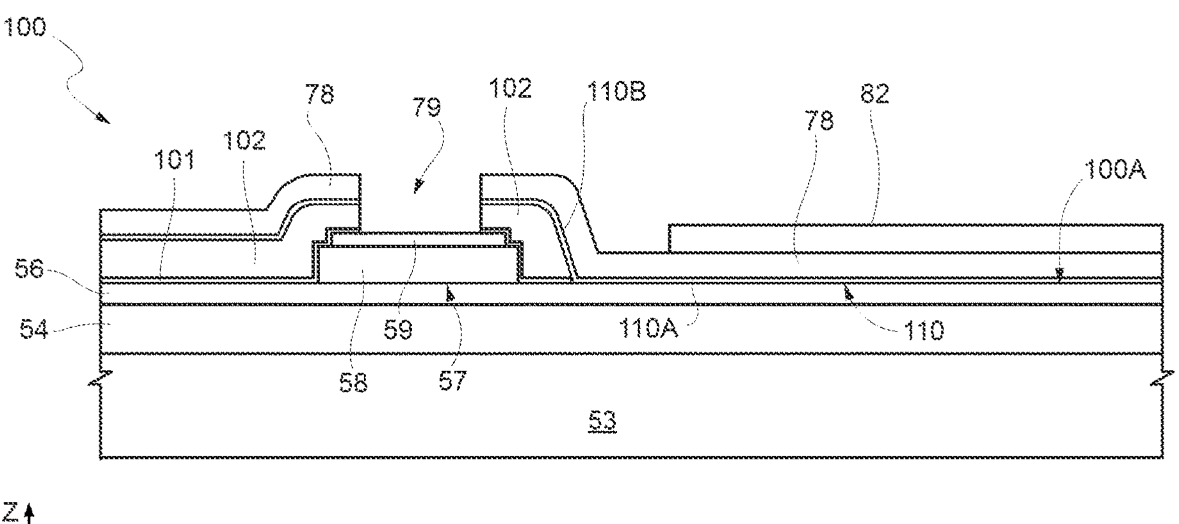
Figure 3F:
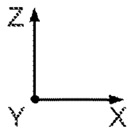

In FIG. 3F, first insulating layer 78, passivation layer 110, spacer layer 102 and work sealing layer 101 are etched using a mask (not shown) to form gate opening 79, thereby exposing the top surface of gate region 57.

Figure 3G:
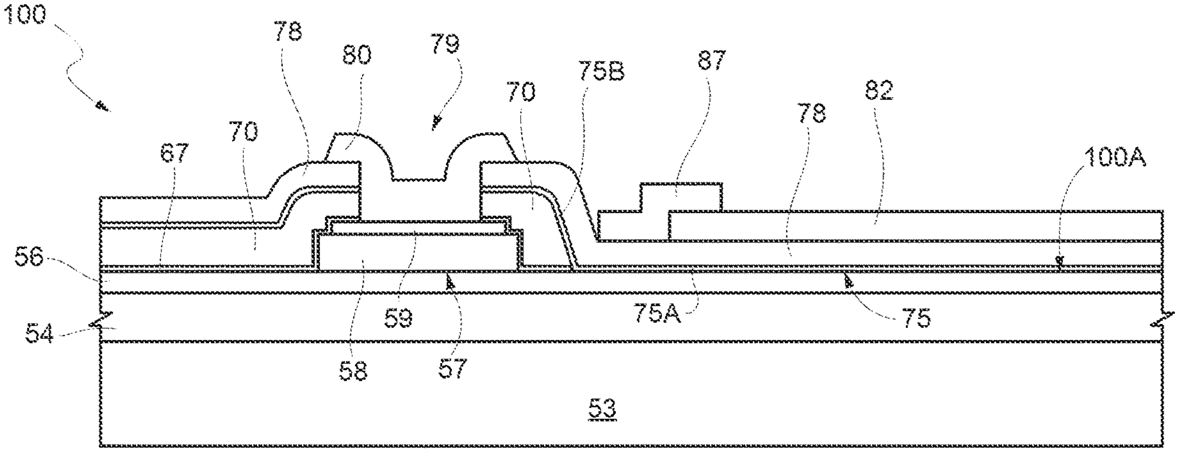
Figure 3G:
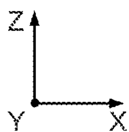

In FIG. 3G, a gate metal layer is deposited and defined to form, in gate opening 79, gate metal 80 and, laterally thereto, field plate 87. Gate metal layer may be a multilayer of TiN/AlCu/TiN.

Then, in a manner not shown, third insulating layer 83 is deposited; source and drain openings 84, 85 are formed; and source/drain metal layer is deposited and defined to form source region 61 and drain region 62.

Final manufacturing steps then follow, including depositing an outer passivation layer; formation of electrical contacts on the gate metal 80 and on source and drain regions 61, 62; and dicing of the wafer 100, thereby obtaining HEMT device 50 of FIG. 2.

Figures 4A, 4B, 4C:
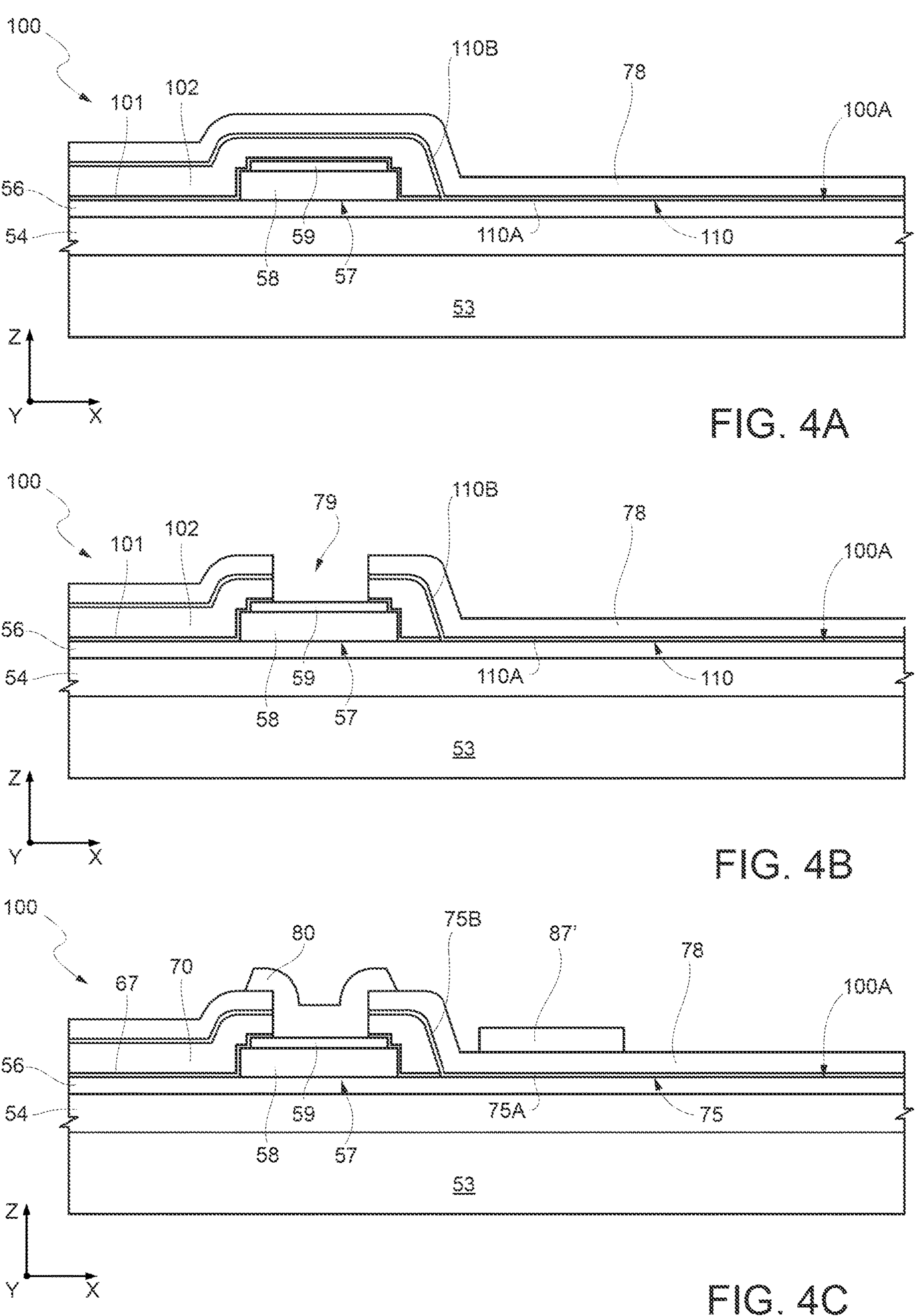
FIG. 4A-4C are cross-sections of a semiconductor wafer in subsequent manufacturing steps of some embodiments of the HEMT device.

FIGS. 4A-4C show manufacturing steps of the HEMT device according to a different embodiment, wherein the field plate has a planar structure.

FIG. 4A shows wafer 100 at the step of FIG. 3E. Here, only the first insulating layer 78 has been formed, whereas the second insulating region 82 has not been formed.

Then, FIG. 4B, gate opening 79 is formed analogously to what described with reference to FIG. 3F and, FIG. 4C, gate metal layer is deposited and defined.

Therefore, gate metal 80 is formed in gate opening 79 and field plate 87' is formed on the first insulating layer 78.

In this embodiment, field plate 87' extends only on top of the first insulating layer 78, in direct contact therewith. In practice, field plate 87' extends, along axis X, substantially at a constant distance from barrier layer 56.

Then, final manufacturing steps follow, as described above.

Figure 5:
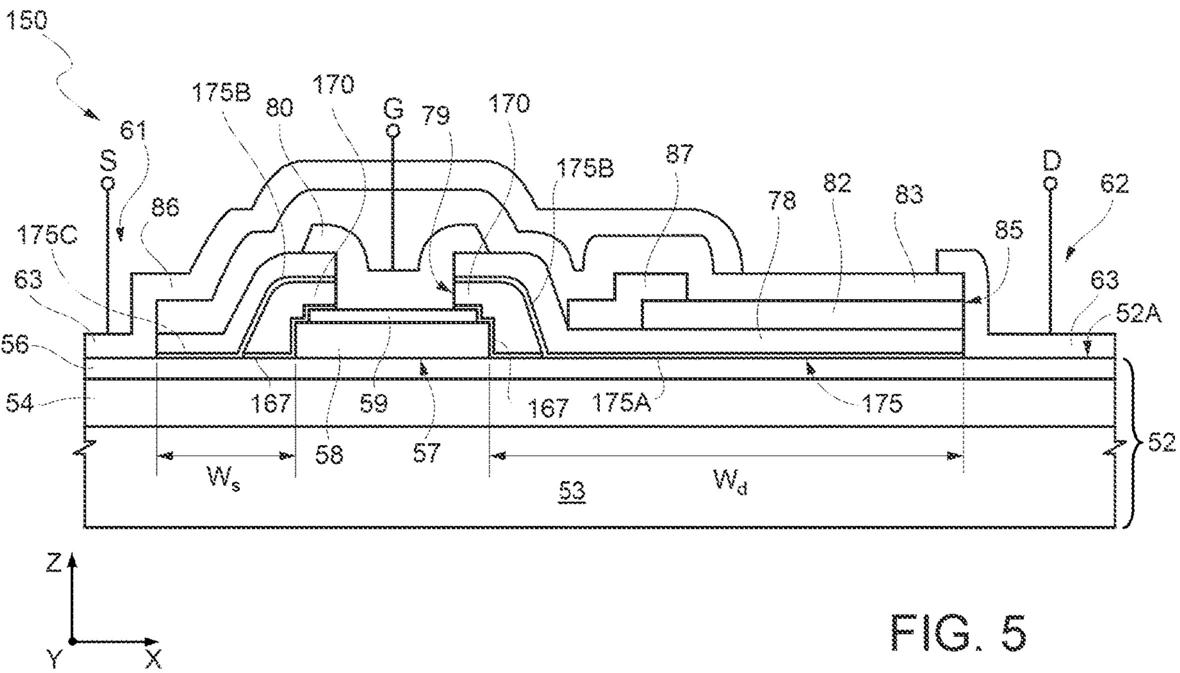
FIG. 5 is a cross-section of a HEMT device according to another embodiment.

FIG. 5 shows the HEMT device, here indicated by 150, according to a different embodiment.

HEMT device 150 has a general structure similar to the HEMT device 50 of FIG. 2; therefore, elements in common are indicated by the same reference numerals and are not further described in detail.

In this embodiment, the sealing layer, indicated by 167, extends on the top surface 52A of the body 52, on the source-side of gate region 57, only for a portion of the distance the distance $W_d$ between the gate region 57 and the contact portion 63 of the source region 61.

Spacer regions, indicated by 170 in FIG. 5, overlie also here sealing layer 167, in direct contact therewith.

In this embodiment, the passivation layer, indicated by 175 in FIG. 5, extends on spacer regions 170 and on portions of the top surface 52A both on the drain-side of the gate region 57 and on the source-side of the gate region 57.

In detail, passivation layer 175 has a surface portion 175A that extends on the top surface 52A on the drain-side of the gate region 57, and a surface portion 175C that extends on the top surface 52A on the source-side of the gate region 57.

Raised portions 175B of passivation layer 175 extend on spacer regions 170, in particular overlie thereon and in contact therewith.

Surface portions 175A, 175C may have a monocrystalline structure, whereas raised portions 175B may have a polycrystalline structure, as discussed for portions 75A, 75B with reference to FIG. 2.

What discussed for the passivation layer 75 of HEMT device 50 also applies for passivation layer 175 of HEMT 150.

Therefore, presence of surface portion 175C of passivation layer 175 allows to tailor and optimize the density of the 2DEG also on the source-side of the gate region 57.

HEMT device 150 may thus achieve good trade-off between gate current, threshold voltage and on-resistance.

Moreover, here, passivation layer 175 may allow to reconstruct possible defects of the barrier layer 56 at the top surface 52A, also on the source-side of the gate region 57.

The person skilled in the art would understand that the HEMT device 150 may be manufactured by similar steps as the ones shown in FIGS. 3A-3G for HEMT device 50. For example, in this case, mask 104 of FIG. 3C may have a second opening, also on the source-side of the gate region 57, in order to remove portions of the work spacer layer 102 and work sealing layer 101 also on the source-side, thereby allowing also the formation of the surface portion 175C during the deposition step of FIG. 3D.

Figure 6:
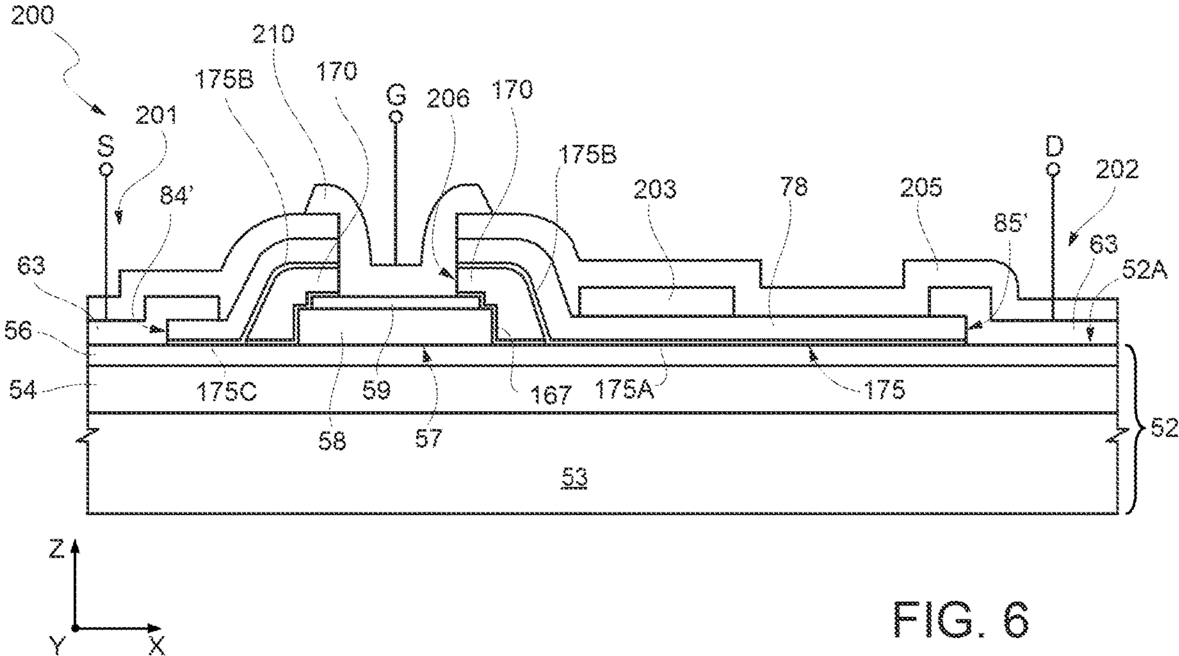
FIG. 6 is a cross-section of a HEMT device according to a further embodiment.

FIG. 6 shows an HEMT device 200 wherein the source and the drain metal regions are formed before the gate metal region.

In FIG. 6, elements in common to HEMT device 150 of FIG. 5 have been indicated using the same reference numbers. After forming the first insulation layer 78 (FIG. 3E or 4A, depending on whether the second insulating region 82 is to be formed)

Source opening, here indicated by 84', and drain opening, here indicated by 85', are formed after forming the first insulating layer 78.

Then, the source and drain regions, here indicated by 201 and 202, are formed by depositing and defining a same metal layer or stack, for example of Ti/AlCu/TiN.

A field plate 203 may be formed together with the source and drain regions 201, 202.

Thereafter, a further insulating layer 205, corresponding to third insulation layer 83 and for example of oxide or nitride, is deposited on the first insulating layer 78 and on source and drain regions 201, 202.

A gate opening 206 thus extends here also through insulating layer 205.

Gate metal 210 extends within the gate opening 206 and, partially, on the insulating layer 205.

Shielding regions may be formed from the same metal layer forming the gate metal 210 or by different metal layers deposited after, in a manner here not shown.

Finally, it is clear that numerous variations and modifications may be made to the HEMT device and process described and illustrated herein, all falling within the scope of the disclosure, as defined in the attached claims.

For example, passivation layer 75, 175 may be of a different insulating material that has a small lattice mismatch with respect to the barrier layer 56, so that the surface portions 75A, 175A, 175C may grow layer-by-layer and have a monocrystalline structure.

In general, passivation layer 75, 175 may have same, smaller or greater thickness than sealing layer 67, 167.

In general, source and drain lateral sidewalls 65, 66 may correspond only to the lateral sidewalls of the channel modulating region 58 or to the lateral sidewalls of both the channel modulating region 58 and the interlayer region 59, depending on the specific structure of the gate region 57 and the specific manufacturing steps used for manufacturing the HEMT device.

In general, the surface portions 75A, 175A, 175C of the passivation layer 75, 175 may each extend between the respective lateral sidewall 65, 66 of the gate region 57 and the respective source or drain contact portion 63 for the whole portion of the top surface 52A that extends, along axis X, from the respective lateral sidewall 65, 66 to the respective contact portion 63 (e.g., for the whole distances $W_d$ and/or $W_s$) or only for a portion of said distances. For example, the surface portions 75A, 175A, 175C of the passivation layer 75, 175 may extend between the respective lateral sidewall 65, 66 of the gate region 57, at a distance therefrom, and the respective source or drain contact portion 63, but not up to the respective contact portion 63.

For example, the distances $W_d$, $W_s$ may be equal with each other or the distance $W_s$ may be greater than the distance $W_d$.

For example, the heterostructure may also include other layers in addition to channel layer 54 and barrier layer 56. For example, the heterostructure may include other semiconductive or insulating layers below the channel layer or above the barrier layer, depending on the specific application of the HEMT device and the specific manufacturing steps used for manufacturing the respective body.

Finally, the embodiments shown and described may be combined to provide further solutions.

A HEMT device (50; 150; 200) may be summarized as including: a body (52) having a top surface (52A) and a heterostructure (54, 56); a gate region (57) comprising a semiconductor material, arranged on the top surface (52A) of the body (52), the gate region having a first lateral sidewall (66) and a second lateral sidewall (65) opposite to the first lateral sidewall; a sealing layer (67; 167) of non-conductive material, extending on and in contact with the first and the second lateral sidewalls (65, 66) of the gate region (57); and a passivation layer (75; 175) of non-conductive material, having a surface portion (75A; 175A, 175C) extending on the top surface (52A) of the body (52), laterally to the first lateral sidewall (66) of the gate region (57), the sealing layer (67; 167) and the passivation layer (75; 175) having different geometrical parameters and/or being of different material.

A HEMT device may further include: a first current conducting terminal (63, 62) of conductive material, extending on the top surface (52A) of the body (52), at a distance from and laterally to the first lateral sidewall (66) of the gate region (57); a second current conducting terminal (63, 61) of conductive material, extending on the top surface (52A) of the body (52), at a distance from and laterally to the second lateral sidewall (65) of the gate region (57), wherein the surface portion (75A) of the passivation layer (75) is arranged between the gate region and the first current conducting terminal (63, 62), and wherein the passivation layer (75) does not extend on the top surface (52A) of the body (52) between the gate region and the second current conducting terminal (63, 61).

A HEMT device may further include: a first current conducting terminal (62; 202) of conductive material, extending on the top surface (52A) of the body (52), at a distance from and laterally to the first lateral sidewall (66) of the gate region (57); and a second current conducting terminal (61; 201) of conductive material, extending on the top surface (52A) of the body (52), at a distance from and laterally to the second lateral sidewall (65) of the gate region (57), wherein the surface portion of the passivation layer (175) is a first surface portion (175A) arranged between the gate region and the first current conducting terminal (62; 202), and the passivation layer further having a second surface portion (175C) extending on the top surface (52A) of the body (52), arranged laterally to the second lateral sidewall (65) of the gate region and between the gate region and the second current conducting terminal (61; 201).

The sealing layer (67; 167) may be of an oxide, for example chosen in the group comprising: $Al_2O_3$, $HfO_2$ and AlON.

The sealing layer (67; 167) may have a thickness comprised between 2 and 10 nm, for example of 2.5 nm.

The passivation layer (75; 175) may be of a nitride, in particular of AlN.

The passivation layer (75; 175) may have a thickness comprised between 2 and 10 nm, for example of 5 nm.

The passivation layer (75; 175) may have a greater thickness than the sealing layer (75; 175).

The sealing layer (67; 167) may also extend, partially, on a top surface of the gate region (57), the HEMT device further comprising spacer regions (70; 170) of non-conductive material, extending on the sealing layer (67; 167) and in contact therewith, the passivation layer (75; 175) further having raised portions (75B; 175B) extending on the spacer regions (70; 170) and in contact therewith.

A HEMT device may further include a field plate region (87; 87'; 203) of conductive material, extending laterally to the first or the second lateral sidewall of the gate region and at a distance from the gate region, above the top surface (52A) of the body (52).

The heterostructure may include a channel layer (54) and a barrier layer (56) extending on the barrier layer, the barrier layer forming the top surface (52A) of the body, wherein the surface portion (75A; 175A, 175C) of the passivation layer (75; 175) may extend directly on the barrier layer and has a monocrystalline structure.

A process for manufacturing a HEMT device (50; 150; 200), the process may be summarized as including: on a wafer (80) having a top surface (80A) and a heterostructure (54, 56), forming a gate region (57), the gate region including a semiconductor material and arranged on the top surface of the body, the gate region having a first lateral sidewall (66) and a second lateral sidewall (65) opposite to the first lateral sidewall; forming a sealing layer (67; 167) of non-conductive material, extending on and in contact with the first and the second lateral sidewalls (65, 66) of the gate region (57); and forming a passivation layer (75; 175) of non-conductive material, the passivation layer having a surface portion (75A; 175A, 175C) extending on the top surface (52A) of the body (52), laterally to the first lateral sidewall (66) of the gate region (57), the sealing layer (67; 167) and the passivation layer (75; 175) having different geometrical parameters and/or being of different material.

Forming a sealing layer (67; 167) may include: depositing, on the gate region (57) and on the top surface (52A) of the body (52), a work sealing layer (101); depositing a work spacer layer (102) on the work sealing layer; forming a mask (104) above the work spacer layer, having an opening above a portion of the top surface of the wafer that is arranged at a distance from the gate region and laterally to the first lateral sidewall (66) of the gate region; and selectively removing the work sealing layer (101) and the work spacer layer by using the mask (104), wherein forming a passivation layer comprises depositing a work passivation layer (110) after the selective removal of the work sealing layer and the work spacer layer.

A process may further include: forming an insulation structure (78, 82, 83; 78, 205) on the passivation layer (75; 175); forming a gate opening (79; 206) exposing at least partially a top surface of the gate region (57) and extending at least in part through the insulation structure; forming a gate control terminal (68) of conductive material on the gate region, within the gate opening (79); forming a first current conducting terminal (62; 202) of conductive material, extending on and in contact with the top surface of the body (52) laterally to the first lateral sidewall (66) of the gate region (57); and forming a second current conducting terminal (61; 201) of conductive material, extending on and in contact with the top surface of the body (52) laterally to the second lateral sidewall (65) of the gate region (57).

The first and second current conducting terminals (61, 62) may be formed after forming the gate control terminal (80).

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A HEMT device comprising:

a body having a top surface and a heterostructure;

a gate region including a semiconductor material, arranged on the top surface of the body, the gate region having a first lateral sidewall and a second lateral sidewall opposite to the first lateral sidewall;

a sealing layer of non-conductive material, extending on and in contact with the first and the second lateral sidewalls of the gate region;

a passivation layer of non-conductive material, having a surface portion extending on the top surface of the body, laterally to the first lateral sidewall of the gate region, the sealing layer and the passivation layer having different geometrical parameters; and a spacer region of non-conductive material between the passivation layer and the sealing layer, the spacer region separating the sealing layer and the passivation layer where the passivation layer is not on the top surface of the body.

2. The HEMT device according to claim 1, further comprising:

a first current conducting terminal of conductive material, extending on the top surface of the body, at a distance from and laterally to the first lateral sidewall of the gate region;

a second current conducting terminal of conductive material, extending on the top surface of the body, at a distance from and laterally to the second lateral sidewall of the gate region, wherein the surface portion of the passivation layer is arranged between the gate region and the first current conducting terminal, and wherein the passivation layer does not extend on the top surface of the body between the gate region and the second current conducting terminal.

3. The HEMT device according to claim 1, further comprising:

a first current conducting terminal of conductive material, extending on the top surface of the body, at a distance from and laterally to the first lateral sidewall of the gate region; and a second current conducting terminal of conductive material, extending on the top surface of the body, at a distance from and laterally to the second lateral sidewall of the gate region, wherein the surface portion of the passivation layer is a first surface portion arranged between the gate region and the first current conducting terminal, and the passivation layer further having a second surface portion extending on the top surface of the body, arranged laterally to the second lateral sidewall of the gate region and between the gate region and the second current conducting terminal.

4. The HEMT device according to claim 1, wherein the sealing layer is of an oxide, chosen in the group comprising: $Al_2O_3$, $HfO_2$ and AlON.

5. The HEMT device according to claim 1, wherein the sealing layer has a thickness between 2 and 10 nm.

6. The HEMT device according to claim 1, wherein the passivation layer is of a nitride.

7. The HEMT device according to claim 1, wherein the passivation layer has a thickness of 5 nm.

8. The HEMT device according to claim 1, wherein the passivation layer has a greater thickness than the sealing layer.

9. The HEMT device according to claim 1, wherein the sealing layer also extends, partially, on a top surface of the gate region, the passivation layer further having raised portions extending on the spacer regions and in contact therewith.

10. The HEMT device according to claim 1, further comprising a field plate region of conductive material, extending laterally to the first or the second lateral sidewall of the gate region and at a distance from the gate region, above the top surface of the body.

11. The HEMT device according to claim 1, wherein the heterostructure comprises a channel layer and a barrier layer extending on the barrier layer, the barrier layer forming the top surface of the body, wherein the surface portion of the passivation layer extends directly on the barrier layer and has a monocrystalline structure.

12. A process for manufacturing a HEMT device, the process comprising:

on a wafer having a top surface and a heterostructure, forming a gate region, the gate region including a semiconductor material and arranged on the top surface of the body, the gate region having a first lateral sidewall and a second lateral sidewall opposite to the first lateral sidewall;

forming a sealing layer of non-conductive material, extending on and in contact with the first and the second lateral sidewalls of the gate region;

forming a spacer region of non-conductive material, extending and in contact with the sealing layer; and forming a passivation layer of non-conductive material, the passivation layer having a surface portion extending on the top surface of the body, laterally to the first lateral sidewall of the gate region, the sealing layer and the passivation layer having different geometrical parameters and/or being of different material, the spacer region being between the sealing layer and the passivation layer, the spacer region separating the sealing layer and the passivation layer where the passivation layer is not on the top surface of the body.

13. The process according to claim 12, wherein forming a sealing layer includes:

depositing, on the gate region and on the top surface of the body, a work sealing layer;

depositing a work spacer layer on the work sealing layer;

forming a mask above the work spacer layer, having an opening above a portion of the top surface of the wafer that is arranged at a distance from the gate region and laterally to the first lateral sidewall of the gate region; and selectively removing the work sealing layer and the work spacer layer by using the mask, wherein forming a passivation layer comprises depositing a work passivation layer after the selective removal of the work sealing layer and the work spacer layer.

14. The process according to claim 12, further comprising:

forming an insulation structure on the passivation layer;

forming a gate opening exposing at least partially a top surface of the gate region and extending at least in part through the insulation structure;

forming a gate control terminal of conductive material on the gate region, within the gate opening;

forming a first current conducting terminal of conductive material, extending on and in contact with the top surface of the body laterally to the first lateral sidewall of the gate region; and forming a second current conducting terminal of conductive material, extending on and in contact with the top surface of the body laterally to the second lateral sidewall of the gate region.

15. The process according to claim 14, wherein the first and second current conducting terminals are formed after forming the gate control terminal.

16. The process according to claim 15, wherein the spacer region is formed after forming the sealing layer.

17. The process according to claim 16, wherein the spacer region is formed before forming the passivation layer.

18. The process according to claim 17, further including:

forming a field plate region of conductive material, extending laterally to the first or the second lateral sidewall of the gate region and at a distance from the gate region, above the top surface of the body.

19. A high electron mobility transistor (HEMT) device, comprising:

a heterostructure having a first surface;

a gate region including a semiconductor material, on the first surface, the gate region having a first lateral sidewall and a second lateral sidewall opposite to the first lateral sidewall, the gate region having a second surface opposing the first surface, and the second surface traverse to the lateral sidewalls;

a sealing layer of non-conductive material, on and in contact with the first and the second lateral sidewalls of the gate region;

a passivation layer on the first surface, laterally on the first lateral sidewall of the gate region, the passivation layer is on the second surface; and a spacer region of non-conductive material between the passivation layer and the sealing layer.

20. The device of claim 19, wherein the passivation layer has a greater thickness than the sealing layer.

* * * * *